United States Patent

Steffan et al.

Patent Number: 6,063,685
Date of Patent: May 16, 2000

[54] DEVICE LEVEL IDENTIFICATION METHODOLOGY

[75] Inventors: Paul J. Steffan, Elk Grove, Calif.; Michael McIntyre; Charlie Reading, both of Austin, Tex.

[73] Assignee: Advanced Micro Devices, Inc., Sunnyvale, Calif.

[21] Appl. No.: 09/131,284

[22] Filed: Aug. 7, 1998

[51] Int. Cl.[7] .................................................. H01L 21/76
[52] U.S. Cl. ........................... 438/401; 438/462; 438/800
[58] Field of Search .................................... 438/401, 462, 438/800, 14, 15; 219/12.68, 121.69; 430/312

[56] References Cited

U.S. PATENT DOCUMENTS

| | | | |
|---|---|---|---|
| 5,093,550 | 3/1992 | Gerber et al. | 219/121.69 |
| 5,410,124 | 4/1995 | Jackson | 219/121.68 |
| 5,733,711 | 3/1998 | Juengling | 430/312 |

*Primary Examiner*—Charles Bowers
*Assistant Examiner*—Craig Thompson
*Attorney, Agent, or Firm*—H. D. Nelson

[57] ABSTRACT

A method of identifying individual semiconductor devices with a unique inscription during the manufacturing process for the semiconductor devices. Each individual semiconductor device is marked during a final lithographic stepping exposure with a direct write laser mounted either in the stepper in the lithographic system working concurrently with the stepping fields during the final metal layer lithographic stepping exposure or during a post stepping pre-development treatment. The marking on the devices includes device identification, lot number and die number.

7 Claims, 1 Drawing Sheet

DEVICE LEVEL IDENTIFICATION METHODOLOGY

BACKGROUND OF THE INVENTION

1. Field of the Invention

This invention relates generally to the manufacture of semiconductor devices. More specifically, this invention relates to a method of marking each die on a wafer during the manufacture of semiconductor devices with identification information. Even more specifically, this invention relates to a method of marking each die on a wafer during the manufacture of semiconductor devices with identification information that can identify and distinguish each die from every other die manufactured by the same manufacturer.

2. Discussion of the Related Art

Modern electronic systems, such as computer systems typically contain several semiconductor devices, each of which has a specific function or specific functions to perform. Each of these functions must be performed correctly or the electronic system will not function properly. When one of the modern electronic systems fails, it is desirable for the manufacturer of the electronic system to determine which semiconductor device caused the failure. In addition, when the specific semiconductor device that caused the failure is identified, it is desirable for the manufacturer of the specific semiconductor device to be able to identify in which manufacturing lot the semiconductor device was manufactured during testing procedures such as customer return failure analysis. These testing procedure assist the manufacturer of the semiconductor device to determine the manufacturing dependent anomalies associated with that individual die. These anomalies include inline defects, bit map failure data, high/low WET data, which could immediately point to the root cause of the failure, or at least provide information that would allow for intelligent de-processing to confirm a probable cause of the failure. The difficulty with retaining this level of accounting is the massive logistic concerns involved with keeping track of the millions of semiconductor die through the various assembly operations in a typical assembly house. Until the die is finally packaged and marked, there is no current method of monitoring these identities.

For example, computer systems typically contain one or more microprocessors that execute code or instructions for an operating system, applications programs and other hardware and software elements of the computer system. Such a microprocessor or microprocessors are at the core of what is referred to as a central processing unit (CPU). In addition, the CPU is typically and preferably implemented on a single semiconductor integrated circuit chip. Such a semiconductor integrated circuit chip is referred to as a CPU, a CPU chip, or simply as a microprocessor.

Semiconductor integrated circuit chip manufacturers produce and market microprocessors having a variety of available clock speeds. In general, a higher clock speed for a microprocessor yields higher instruction execution performance. The higher instruction execution performance is valuable to the end user and certain end users, depending upon for what application the system is to be used, are willing to pay a premium for the higher instruction execution performance that is obtainable with a higher clock speed. For example, multimedia applications increasingly require faster clock speeds. Applications that require high clock speed microprocessors include applications that provide full motion video, applications that provide complex graphics, etc.

It is critically important that a microprocessor is not run at clock speeds in excess of the speed determined by the manufacturer's testing procedure and guaranteed by the manufacturer. Operating the microprocessor above the manufacturer's specifications creates potential reliability issues that can cause the microprocessor and/or end user applications to malfunction and to fail.

It has been found that microprocessors that have been certified and sold at a particular speed have been re-marked at a higher speed. These re-marked microprocessors are "over-clocked," that is, they are being run above the manufacturer's specified speed. By doing so, the system with the over-clocked microprocessor can be sold at a premium which is unjustified. Failure of such systems to operate properly at the mismarked speed cause end user dissatisfaction with the system. This end user dissatisfaction is usually directed at the manufacturer and results in damage to the manufacturer's reputation, goodwill, and can affect future sales. The sale of such mismarked over-clocked systems can cost microprocessor chip manufacturers millions of dollars in lost sales (of properly marked higher speed microprocessors as well as future sales) and in repair and replacement costs. In addition, manufacturers have sometime been put in the position of having to replace mismarked parts to protect their reputation.

There are problems with computer systems because the semiconductor integrated circuit chip manufacturers typically evolve microprocessor architectures on a development schedule independently of the schedule of new software releases by vendors of operating systems and BIOS. As a consequence, the performance information for a particular operating system or BIOS release may not coincide with the performance information for newer microprocessor chips. Such an information mismatch can cause an operating system or BIOS to misidentify the performance information for a particular microprocessor installed in a system. Because the rate of improvements in microprocessor architectures and process technologies has accelerated resulting in an increased likelihood that an operating system or BIOS will misidentify the performance of the microprocessor installed in a particular system due to such an information mismatch.

Another problem that is becoming more prevalent in the semiconductor industry is the theft of semiconductor devices. There is currently no method of positively identifying semiconductor devices such as microprocessors as being stolen property because semiconductor devices from wafer look exactly alike. This means that millions of semiconductor devices look exactly alike.

Therefore, what is needed is a method of identifying individual die for failure analysis, detection of overclocking and positive identification of stolen die.

SUMMARY OF THE INVENTION

According to the present invention, the foregoing and other objects and advantages are attained by a method of identifying individual semiconductor devices during the manufacturing process for the semiconductor devices. Each individual semiconductor device is marked during a final lithographic stepping exposure with a direct write laser mounted either in the stepper in the lithographic system working concurrently with the stepping fields during the final metal layer lithographic stepping exposure or alternatively during a post stepping pre-development treatment. The marking on the devices includes device identification, lot number and die number The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Figure 1:
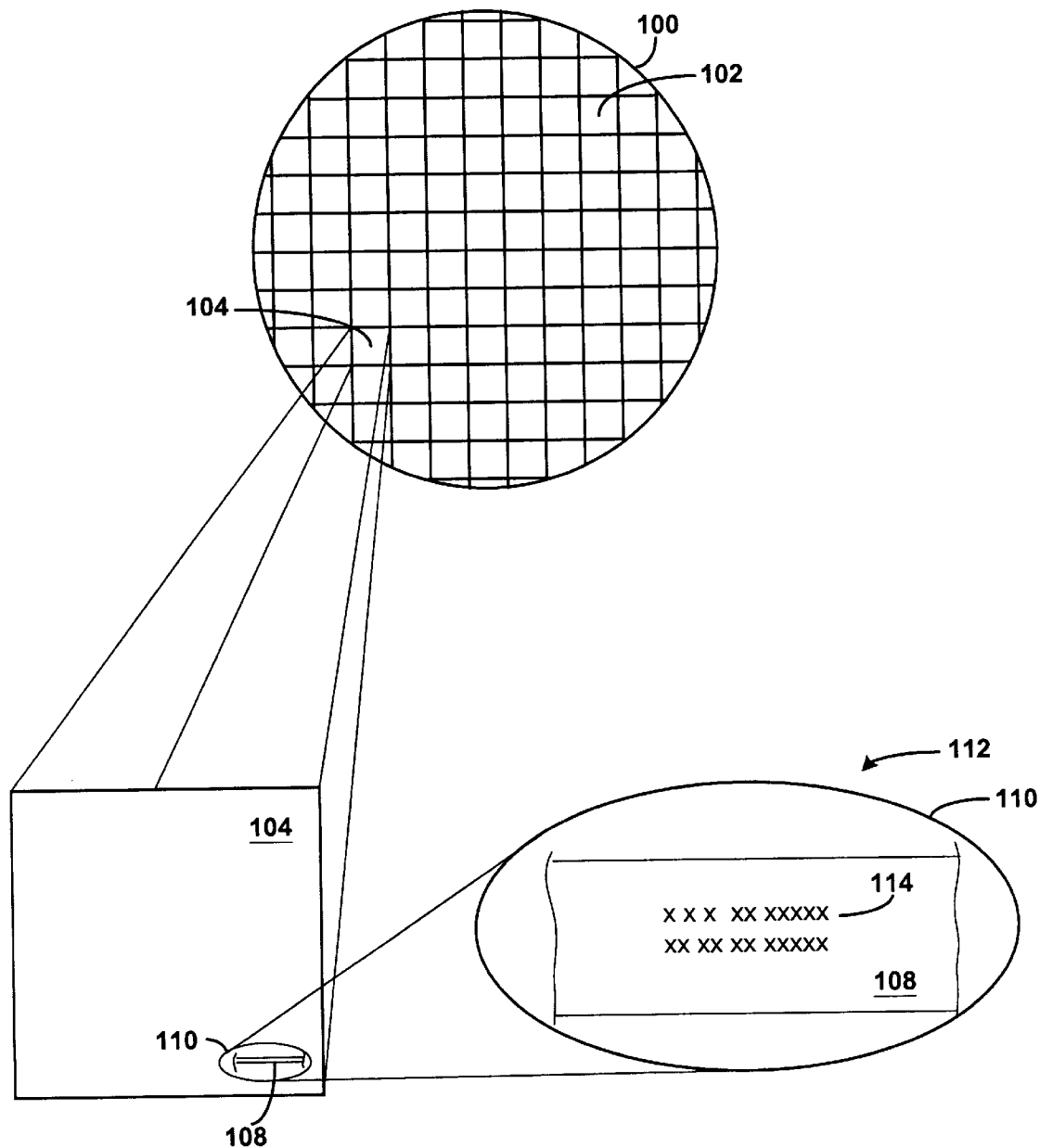
FIG. 1 shows the methodology of the present invention.

Reference is now made in detail to a specific embodiment of the present invention which illustrate the best mode presently contemplated by the inventors for practicing the invention.

FIG. 1 shows a wafer 100 with individual die 102 formed on the wafer 100. A specific die 104 is shown in larger detail at 106 showing a portion 108 of the die 104 within ellipse 110. The ellipse 110 is shown enlarged at 112 and shows the portion 108 of the die 104. An inscription 114 is shown on the portion 108 of the die 104. It should be understood that a similar inscription is placed on all the other die on the wafer, the only exception would be that the other die would have a different number to identify the specific die.

The inscription could be placed on the die 104, for example, during the final metal layer lithographic stepping exposure by a direct write laser, either mounted in the stepper and working concurrently with the stepping fields, or as a post stepping pre-develop treatment. The direct write laser would expose the unexposed photo-resist on a designated area of the die 104 with such information as device, lot number, wafer number and die number or some other designator that can be translated to die level. This information would be easily readable on any finished component returned from the field, or at any stage following the final metal etch treatment. Since upper metal layers on a semiconductor device tend to not be very dense, it should be relatively easy to allocate an area on the die for such an inscription.

The benefits of the invention are as follows:

1. It provides the ability to retrieve die level processing data on customer returns, including inline defects, images, WET data, sort hard and soft binning and final test parametrics.
2. It provides the ability to do and retain wafer/die level stepper exposure "corner" splits to final test and beyond.
3. It provides the ability to track wafer positional effects through assembly.
4. It provides ease of tracking assembly splits and tests.
5. It provides a means for positive identification in case of theft.
6. It provides a means for positive identification in case of speed grade doctering.

In summary, the results and advantages of the present invention can now be more fully realized. The marking of each die provides positive identification for customer return failure analysis, in cases of theft and in cases of overclocking.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of identifying individual semiconductor devices during a manufacturing process, wherein the method comprises marking each individual semiconductor device with a unique inscription during the manufacturing process.

2. The method of claim 1 wherein marking each individual semiconductor device is accomplished during a final metal layer lithographic stepping exposure in the manufacturing process.

3. The method of claim 2 wherein marking each individual semiconductor device is accomplished during the final metal layer lithographic stepping exposure in the manufacturing process is accomplished by a direct write laser.

4. The method of claim 3 wherein the direct write laser is mounted in a stepper in a lithographic system and accomplishes the marking concurrently with the stepping fields during the final metal layer lithographic stepping exposure.

5. The method of claim 3 wherein the direct write laser exposes a layer of photo-resist during a post stepping pre-development treatment.

6. The method of claim 4 wherein the marking includes device identification, lot number, and die number.

7. The method of claim 5 wherein the marking includes device identification, lot number, and die number.

* * * * *